(12) United States Patent
Shiota et al.

(10) Patent No.: US 7,615,467 B2
(45) Date of Patent: Nov. 10, 2009

(54) METHOD FOR MANUFACTURING SOI WAFER

(75) Inventors: Takaaki Shiota, Karatsu (JP); Yasuhiro Oura, Imari (JP)

(73) Assignee: Sumco Corporation, Tokyo (JP)

( * ) Notice: Subject to any disclaimer, the term of this patent is extended or adjusted under 35 U.S.C. 154(b) by 265 days.

(21) Appl. No.: 11/289,306

(22) Filed: Nov. 30, 2005

(65) Prior Publication Data

US 2006/0121692 A1 Jun. 8, 2006

(30) Foreign Application Priority Data

Dec. 2, 2004 (JP) .............................. 2004-350286

(51) Int. Cl.
*H01L 21/301* (2006.01)
(52) U.S. Cl. .............................. 438/459; 257/E21.568; 257/E21.57
(58) Field of Classification Search .............................
257/E21.122–E21.128, E21.567–E21.57,
257/E27.112; 438/502, 509, 660–664, 530,
438/540, 459
See application file for complete search history.

(56) References Cited

U.S. PATENT DOCUMENTS

| 6,180,220 B1 * | 1/2001 | Falster et al. ............. 428/312.6 |
| 2003/0013273 A1 * | 1/2003 | Naruoka et al. ............. 438/455 |
| 2004/0053516 A1 * | 3/2004 | Nakada et al. ............. 438/795 |

FOREIGN PATENT DOCUMENTS

| JP | 2000-031439 | * | 1/2000 |
| JP | 2001-44398 A | | 2/2001 |

* cited by examiner

*Primary Examiner*—W. David Coleman
*Assistant Examiner*—Sonya D McCall-Shepard
(74) *Attorney, Agent, or Firm*—Pillsbury Winthrop Shaw Pittman, LLP

(57) ABSTRACT

This method for manufacturing an SOI wafer includes: a step of subjecting a mirror-polished active layer wafer to a rapid thermal annealing treatment; a step of forming insulating films in a front surface and a rear surface of the active layer wafer; a step of bonding the active layer wafer and a support wafer with the insulating film therebetween so as to form a bonded wafer; a step of loading the bonded wafer on a wafer boat in a state such that a portion of the active layer wafer is in contact with the wafer boat, and then subjecting the bonded wafer to a heat treatment for bonding enhancement which enhances a bonding strength between the active layer wafer and the support wafer in the bonded wafer; and a step of thinning a portion of the active layer wafer.

3 Claims, 2 Drawing Sheets

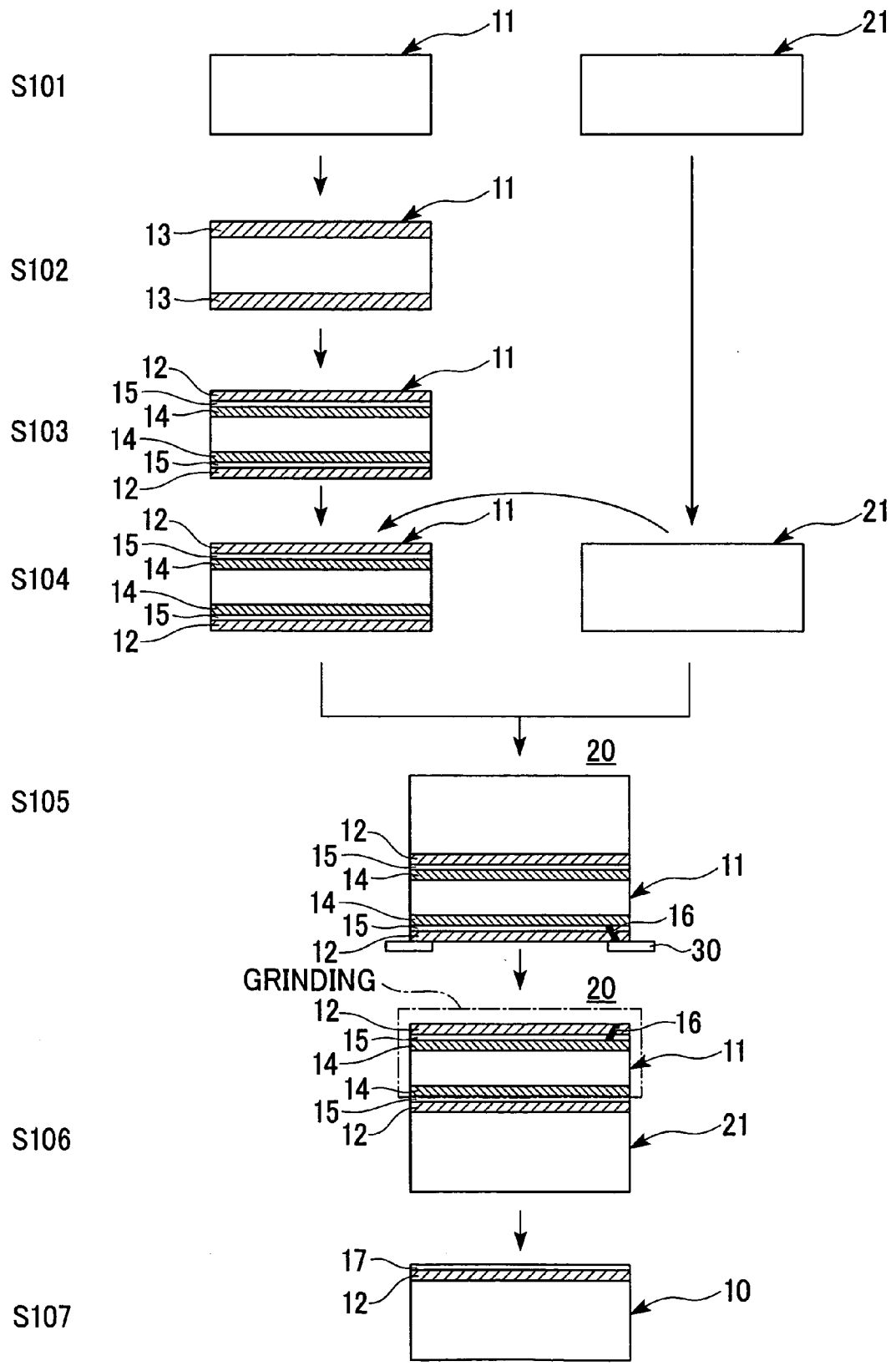

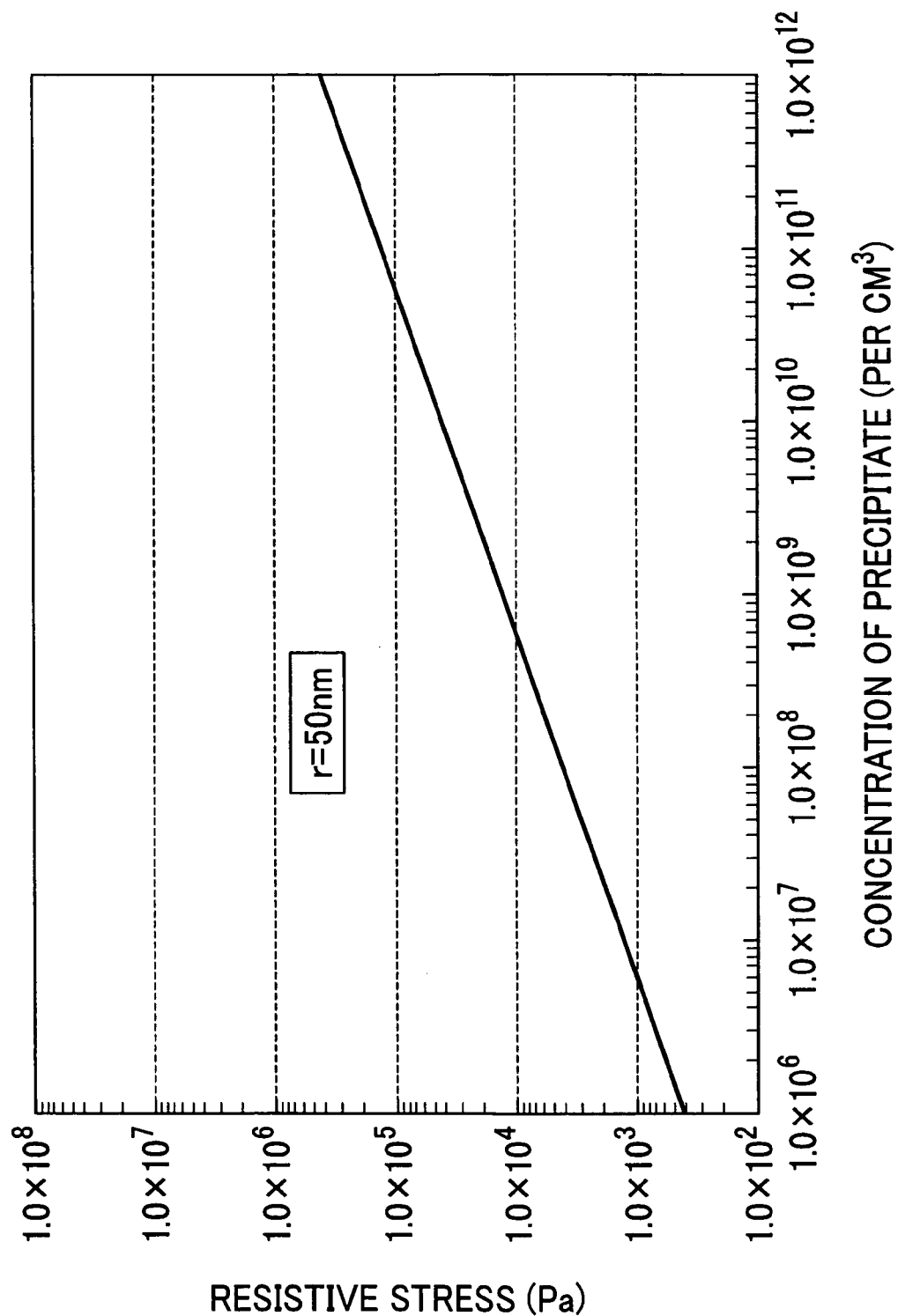

METHOD FOR MANUFACTURING SOI WAFER

BACKGROUND OF THE INVENTION

1. Field of the Invention

The present invention relates to a method for manufacturing an SOI wafer, more specifically it relates to an improvement in a method for manufacturing an SOI wafer in which an active layer wafer and a support wafer are bonded together.

This application claims priority from Japanese Patent Application No.2004-350286 filed on Dec. 2, 2004, the content of which is incorporated herein by reference.

2. Background Art

Compared with conventional silicon wafers, SOI (Silicon On Insulator) wafers having an SOI layer have advantages such as providing a separation between elements and a reduction in parasitic capacitance between elements and a substrate, and having the capability to form a three-dimensional configuration; thereby the SOI wafers are used for high speed, low power consumption LSI circuits. An examples of one of the methods for manufacturing an SOI wafer is a bonding method in which an oxide film is formed in at least one of two silicon wafers and the silicon wafers are bonded, and then the bonded wafer is ground and polished so as to form an SOI layer.

Regarding the bonding method, the SOI wafer may be manufactured, for example, as follows as described in Patent Document 1. At first, an active layer wafer of which one surface is mirror-polished and a support wafer of which one surface is mirror-polished are prepared. Next, an insulating film (an oxide film) having a predetermined thickness is formed in a surface (a mirror-polished surface) of the active layer wafer. And then, the active layer wafer and the support wafer are bonded together to form a bonded wafer such that the surface (the mirror-polished surface) in which the oxide film is formed and the surface (the mirror surface) of the support wafer are used as bonding surfaces.

After the bonding, the bonded wafer is subjected to a heat treatment so as to enhance the bonding strength between the active layer wafer and the support wafer. After this, a portion of the active layer wafer is ground and polished; thereby, an SOI wafer having an SOI layer of a predetermined thickness can be obtained.

When the bonded wafer is subjected to the heat treatment for bonding enhancement, the bonded wafer is loaded on a wafer boat. Generally, a contact surface contacting with the wafer boat is on the support wafer side.

As a result, when the bonded wafer is subjected to the heat treatment for bonding enhancement, slip dislocations occur in the support wafer due to the contact with the wafer boat. In detail, weight of the bonded wafer is concentrated on a portion contacting with the wafer boat, such as a portion of an outer circumference of the support wafer. This generates an internal stress in the wafer exceeding a critical shearing stress, thereby causing the slip dislocations in that portion contacting with the wafer boat in the support wafer. As a result, the mechanical strength of the SOI wafer is deteriorated by the slip dislocations occurring in the support wafer.

Patent Document 1: Japanese Unexamined Patent Application, First Publication No. 2001-44398

SUMMARY OF THE INVENTION

The present invention has been made for the purpose of solving the problems described above, and has an object of providing a method for manufacturing an SOI wafer which enables the suppression of growth of slip dislocations in a support wafer of a bonded wafer when the bonded wafer is subjected to a heat treatment for bonding enhancement in a state where the bonded wafer is loaded on a wafer boat.

A method for manufacturing an SOI wafer of the present invention includes: a step of subjecting a mirror-polished active layer wafer to a rapid thermal annealing treatment; a step of forming insulating films in a front surface and a rear surface of the active layer wafer; a step of bonding the active layer wafer and a support wafer with the insulating film therebetween so as to form a bonded wafer; a step of loading the bonded wafer on a wafer boat in a state such that a portion of the active layer wafer is in contact with the wafer boat, and then subjecting the bonded wafer to a heat treatment for bonding enhancement which enhances a bonding strength between the active layer wafer and the support wafer in the bonded wafer; and a step of thinning a portion of the active layer wafer.

The active layer wafer and the support wafer are both silicon wafers.

According to the method for manufacturing an SOI wafer of the present invention, at first, the active layer wafer is subjected to RTA (rapid thermal annealing) treatment (heat treatment of rapid heating and rapid cooling). Vacancies are implanted into the front surface and the rear surface of the active layer wafer by the RTA treatment; thereby vacancy layers having a high concentration of vacancies are formed in surface portions thereof. While there is no limitation on the atmosphere in which the RTA treatment is carried out, a nitridation gas atmosphere is preferably employed.

After the RTA treatment, insulating films are formed in a front surface and a rear surface of the active layer wafer. The insulating films may be an oxide film or a nitride film. For example, when the active layer wafer is subjected to a heat treatment in an oxidizing atmosphere such as an atmosphere including oxygen and the like, oxide films are formed as the insulating films in the front surface and the rear surface of the active layer wafer. During this, a large number of oxygen precipitates and interstitial silicon atoms are formed in a bulk portion of the active layer wafer.

The interstitial silicon atoms are diffused towards the surface portions of the active layer wafer, so that the vacancies in the vacancy layers are eliminated. As a result, denuded zone (DZ) layers are formed in the surface portions. Also, bulk micro defect (BMD) layers including a high concentration of the oxygen precipitates are formed in the bulk portion, depending on a distribution of vacancy; under the denuded zone layers and a wafer depth center.

As described above, the BMD layers in the active layer wafer are formed by oxygen precipitates caused by an oxidizing treatment.

Next, the active layer wafer and a support wafer are bonded together while the surface in which the insulating film (the oxide film) is formed is used as the bonding surface. Thus, the bonded wafer in which the insulating film intervenes between the active layer wafer and the support wafer can be obtained.

The bonded wafer is loaded on a wafer boat in a state such that a portion of the active layer wafer is in contact with the wafer boat, and then the bonded wafer is subjected to a heat treatment for bonding enhancement in an oxidizing atmosphere such as an atmosphere including oxygen and the like so as to enhance the bonding strength between the active layer wafer and the support wafer. During this, weight of the bonded wafer is concentrated on portions contacting with the wafer boat, such as portions of an outer circumference of the active layer wafer. Thus, in the portions of the outer circumference of the active layer wafer, an internal stress exceeds a critical shearing stress; thereby slip dislocations tend to be generated in the active layer wafer.

However, the generation of slip dislocations is suppressed by the BMD layers which exist in the bulk portion of the active layer wafer. The reason (mechanism) why the generation of the slip dislocations is suppressed by the BMD layer is that the oxygen precipitates inhibit the movement of the slip dislocations, and the oxygen precipitates generate along dislocation lines; thereby dislocation velocity is lessened. Thereafter, the slip dislocations generated in the active layer wafer are removed together with a portion of the active layer wafer by grinding and polishing (thinning). At the same time, the BMD layer which suppresses the generation of slip dislocations is also removed by grinding and polishing. Therefore, an SOI wafer having a defect-free SOI layer which includes no slip dislocations can be obtained. Here, as for thinning, other methods can be employed, for example, a method including a heat treatment for separation after an ion-implantation, and a polishing of an exposed surface after the separation.

In the method for manufacturing an SOI wafer of the present invention, the rapid thermal annealing (RTA) treatment may be conducted in a nitridation gas atmosphere, the RTA treatment may include: heating up a temperature from room temperature to a preset temperature at a heating up rate of 10 to 100° C./sec; holding the preset temperature for 1 to 60 seconds; and lowering the temperature from the preset temperature to room temperature at a lowering rate of 10 to 100° C./sec, and the preset temperature may be set to in a range from 1100° C. to 1250° C.

In the RTA treatment, the heating up rate is from 10 to 100° C./sec and the lowering rate is from 10 to 100° C./sec. In the case in which either the heating up rate or the lowering rate is less than 10° C./sec, a throughput drops. In the case in which either the heating up rate or the lowering rate exceeds 100° C./sec, an in-plane temperature distribution becomes nonuniform so that curvature and slips are easily formed.

The preset temperature may be held in a range from 1100° C. to 1250° C. In the case in which the preset temperature is less than 1100° C., it is difficult to form the vacancy layer. In the case in which the preset temperature is more than 1250° C., slip dislocations are generated in the active layer wafer, and curvature appears in the active layer silicon wafer.

By this RTA process to which the active layer wafer is subjected, vacancies are implanted into the active layer wafer.

By using the nitridation gas atmosphere such as $N_2$, $NH_3$ and the like, a nitride film can be formed in the surface of the silicon wafer, which facilitates vacancy implantation.

When using a nitridation gas atmosphere including $NH_3$, $NH_3$ dissociates to generate hydrogen, which removes a natural insulating film formed in the surface of the silicon wafer. Furthermore, a nitride film is formed in the surface of the silicon wafer, which facilitates vacancy implantation.

As described above, in the method for manufacturing an SOI wafer in which the heating up rate, the preset temperature, and the lowering rate of the RTA process are specified, the active layer wafer is subjected to the RTA process. The RTA process is carried out in the nitridation gas atmosphere. Thereby, vacancies are implanted in surfaces of the active layer wafer in which oxide films are removed, and vacancy layers including a high concentration of vacancies are formed in surface portions of the active layer wafer.

After this, insulating films are formed in the active layer wafer (for example by applying a heat treatment). Then, the active layer wafer and the support wafer are bonded together, and the bonded wafer is subjected to a heat treatment for bonding enhancement (for example, at 1100° C. for 2 hours). Then, interstitial silicon atoms and oxygen precipitates are formed in a bulk portion of the active layer wafer. In the bulk portion, a BMD layer including a high concentration of the oxygen precipitates is formed. The BMD layer suppresses the generation of slip dislocations due to contact with a wafer boat during the heat treatment for bonding enhancement. Also, the interstitial silicon atoms are diffused towards the surfaces thereof, thereby eliminating vacancies in the vacancy layers in the surface portions. As a result, DZ layers (denuded zone layers) are formed in the surface portions of the active layer wafer. After this, a portion in which the slip dislocations are generated is removed by thinning.

According to the present invention, at first, the active layer wafer is subjected to the RTA treatment. Then, vacancies are implanted in the front surface and the rear surface of the active layer wafer; thereby the vacancy layers are formed in the surface portions. The vacancy layers are used to form the BMD layers in the bulk portion by the subsequent heat treatment (including the heat treatment for bonding enhancement). Also, the denuded zone layers are formed in the surface portions of the active layer wafer.

Next, the active layer wafer and the support wafer are bonded together while the surface in which the oxide film (the insulating film) is formed is used as the bonding surface so as to form the bonded wafer.

The bonded wafer is loaded on the wafer boat and is subjected to the heat treatment for bonding enhancement which enhances the bonding strength between the active layer wafer and the support wafer. During this, weight of the wafer is concentrated on a portion contacting with the wafer boat, such as an outer circumference of the active layer wafer. Thus, an internal stress in the wafer exceeds a critical shearing stress; thereby slip dislocations tend to be generated in that portion.

However, the generation or a growth of slip dislocations is suppressed by the BMD layer existing in the active layer wafer. Thereafter, the slip dislocations generated in the active layer wafer are removed together with a portion of the active layer wafer by grinding and polishing (thinning). At the same time, the BMD layer which suppresses the generation of slip dislocations is also removed by grinding and polishing. Therefore, an SOI wafer having a defect-free SOI layer which includes no slip dislocations can be obtained.

BRIEF DESCRIPTION OF THE DRAWINGS

FIG. 1 is a flowchart illustrating a flow of the method for manufacturing an SOI wafer according to an embodiment of the present invention.

FIG. 2 is a graph showing a relationship between a concentration of oxygen precipitate and a resistive stress in an SOI wafer according to an embodiment of the present invention.

PREFERRED EMBODIMENTS

An embodiment of the present invention will be described below with reference to FIG. 1 and FIG. 2.

At first, a method for manufacturing an SOI wafer 10 will be explained with reference to FIG. 1.

At first, as shown in step S101 in FIG. 1, two silicon wafers having thicknesses of 725 μm, diameters of 200 mm, and resistivities of 20Ω·cm are prepared by slicing from a single-crystal silicon ingot grown by the Czochralski method in which boron is uniformly doped. Then, one surface of each of these silicon wafers is subjected to mirror-polishing by a known process. One of these silicon wafers is used as an active layer wafer 11, and the other is used as a support wafer 21.

Next, as shown in step S102 in FIG. 1, the active layer wafer 11 is put into a rapid heating furnace which is known in the art. The active layer wafer 11 is subjected to a rapid heating and rapid cooling treatment (RTA; Rapid Thermal Annealing) in a nitridation gas atmosphere in the rapid heating furnace. The RTA process is carried out in the nitridation gas atmosphere by heating up a temperature from room temperature to 1250° C. at a heating up rate of 50° C./sec; next, holding the temperature at 1200° C. for 10 seconds; and then, lowering the temperature from 1200° C. to room temperature at a lowering rate of 70° C./sec.

Thus, vacancies are implanted into a front surface and a rear surface of the active layer wafer 11; thereby vacancy layers 13 including a high concentration of vacancies ($1 \times 10^{13}$ atoms/cm$^3$) are formed in surface portions in the front surface and the rear surface.

Since the atmosphere in the RTA process is nitridation gas, nitride films are formed in the surfaces of the active layer wafer, which facilitates vacancy implantation.

Next, as shown in step S103 of FIG. 1, oxide films 12 are formed in the front surface and the rear surface of the active layer wafer 11. The oxide films 12 may also be formed similarly in the front surface and the rear surface of the support wafer 21. The oxide films 12 are formed by charging the silicon wafer in an oxidation furnace and heating the wafer at 1000° C. for 4 hours. Thicknesses of the formed oxide films 12 are, for example, 1500 Å.

During this, in a bulk portion of the active layer wafer 11, a large number of interstitial silicon atoms and oxygen precipitates are formed. The interstitial silicon atoms are diffused towards the surface portions of the active layer wafer 11, so that the vacancies are eliminated. Therefore, denuded zone (DZ) layers 15 having a thickness of 15 μm are formed. Also, a bulk micro defect (BMD) layer 14 including a high concentration of the oxygen precipitates is formed in the bulk portion, depending on a distribution of vacancy; under the denuded zone layers 15 and a wafer depth center. Furthermore, a layer having a low BMD density is formed at an intermediate position of the bulk portion of the active layer wafer 11.

As a result, the active layer wafer 11 having an M-shaped distribution of BMD density in a thickness direction is obtained.

Next, as shown in step S104 in FIG. 1, the active layer wafer 11 and the support wafer 21 are bonded together while the surface (the mirror-polished surface) of the active layer wafer 11 in which the oxide film 12 is formed and the mirror-polished surface of the support wafer 21 are used as bonding surfaces. The bonding is carried out using a predetermined jig at room temperature. As a result, as shown in step S105 in FIG. 1, a bonded wafer 20 in which an insulating film (a BOX layer: a buried oxide film) intervenes in a bonded boundary surface is formed.

After this, the bonded wafer 20 is loaded on a wafer boat 30 such that an outer circumference of the active layer wafer 11 is in contact with the wafer boat 30 so as to be supported. The wafer boat 30 is made of SiC and supports the bonded wafer 20 in a horizontal position by making contact with the bonded wafer 20 at a plurality of points on the outer circumference of the bonded wafer 20 (on the active layer wafer 11 side).

Then, the bonded wafer 20 is subjected to a heat treatment for bonding enhancement in order to enhance a bonding strength between the active layer wafer 11 and the support wafer 21 while the bonded wafer 20 is supported on the wafer boat 30. The heat treatment for bonding enhancement is conducted at a temperature of 1100° C. or more for about 2 hours in an oxidizing gas atmosphere. For example, the bonded wafer 20 is heated at a comparatively slow rate such as 5° C./min in a temperature range of 1000° C. or less; thereby growth of the precipitates is improved.

During this, slip dislocations 16 may be generated in portions in the active layer wafer 11 contacting with the wafer boat 30. However, since there is the BMD layer 14 having a high concentration of oxygen precipitates on the active layer wafer 11 side, generation and growth of the slip dislocations 16 are suppressed by the BMD layer 14.

Then, as shown in step S106 in FIG. 1, a portion of the active layer wafer 11 of the bonded wafer 20 (a surface on the opposite side of the bonded surface) is ground and removed using a grinding system.

During this, the slip dislocations 16 formed in the portions of the outer circumference on the active layer wafer 11 side of the bonded wafer 20 are also removed by grinding. As a result, a defect-free SOI layer which includes no slip dislocations 16 can be obtained.

Then, as shown in step S107 of FIG. 1, a surface (ground surface) of the bonded wafer 20 is polished. The polishing is a known chemical mechanical polishing (polishing of a silicon surface using a polishing cloth and an abrasive compound). As a result, an SOI layer (silicon layer) 17 having a predetermined thickness is formed on a surface of the oxide film (BOX layer) 12.

The SOI layer 17 is formed by the above-described thinning process, thereby; an SOI wafer 10 is completed. The thinning process may also involve, for example, the bonded wafer 20 being subjected to a wet oxidation process in an oxidizing atmosphere. Thereby, an oxide film (not shown) having a predetermined thickness is formed in the surface of the SOI layer 17. Then, the oxide film is removed by, for example, an HF etching; thereby, the SOI layer 17 is thinned.

Next, a relationship between the oxygen precipitates and resistive stress against the slip dislocations caused thereby will be described.

FIG. 2 is a graph showing the relationship between the concentration of oxygen precipitates (per cm$^3$) and the resistive stress (Pa). As the concentration of oxygen precipitates increases, the resistive stress which suppresses the generation of the slip dislocations 16 on the active layer wafer 11 side increases. This relationship is represented by a linear equation as follows.

$$\tau o = 0.6 \cdot (f)^{1/2} \cdot G \cdot b / r$$

where τo is the resistive stress, f is a volume fraction of the oxygen precipitates, G is a modulus of rigidity, b is a magnitude of Burgers vector and r is a radius of the oxygen precipitates. The resistive stress was measured by a Vickers indenting test.

As described above, the generation and the growth of slip dislocations can be suppressed by increasing the concentration of oxygen precipitates.

A preferred embodiment of the present invention has been explained above, but the present invention is not limited to the embodiment. The present invention can be modified by addition, omission, or replacement of the structure to an extent not departing from the spirit of the present invention. The present invention is not limited by the above-described explanation, but is limited only by the scope of the appended claims.

What is claimed is:

1. A method for manufacturing an SOI wafer, the method comprising, in series:

subjecting a mirror-polished active layer wafer having first and second surfaces to a rapid thermal annealing treatment in a nitridation gas atmosphere to form vacancy layers in surface portions of the first and second surfaces of the active layer wafer by implanting vacancies into the surface portions;

subjecting said active layer wafer to a heat treatment in an oxidizing atmosphere to form:
   i) first and second insulating films respectively in the first and second surfaces of said active layer wafer,
   ii) first and second denuded zones respectively in the surface portions of the first and second surfaces of the active layer wafer, by eliminating the vacancies in the vacancy layers with interstitial silicon atoms which are generated in a bulk portion of the active layer wafer and diffused toward the surface portions, and
   iii) bulk micro defect layers in the bulk portion by generating oxygen precipitates in the bulk portion;

bonding the first surface of said active layer wafer and a surface of a support wafer with said insulating film therebetween, so as to form a bonded wafer;

loading said bonded wafer on a wafer boat in a state such that a portion of said active layer wafer is in contact with said wafer boat, and then subjecting said bonded wafer to a heat treatment for bonding enhancement which enhances a bonding strength between said active layer wafer and said support wafer in said bonded wafer; and thinning said active layer wafer by removing the second insulating film, the second denuded zone, the bulk portion, and said bulk micro defect layers, of the active layer wafer, and to form an SOI wafer including the support wafer, the first insulating layer bound on the support wafer, and the first denuded zone formed on the first insulating layer.

2. The method for manufacturing an SOI wafer according to claim 1, wherein said rapid thermal annealing treatment comprises:
heating up a temperature from room temperature to a preset temperature at a heating up rate of 10 to 100° C/sec;
holding said preset temperature for 1 to 60 seconds; and
lowering said temperature from said preset temperature to room temperature at a lowering rate of 10 to 100° C/sec, and wherein said preset temperature is set to be in a range of from 1100° C to 1250° C.

3. The method for manufacturing an SOI wafer according to claim 1, wherein, in the active layer wafer subjected to the rapid thermal annealing treatment, an intermediate layer which has a bulk micro defect density lower than the bulk micro defect density in the bulk micro defect layers is formed between the bulk micro defect layers.

* * * * *